United States Patent
Schweizer et al.

(10) Patent No.: US 7,710,336 B2
(45) Date of Patent: May 4, 2010

(54) METAMATERIAL HAVING THE CAPABILITY OF BROADBAND LEFT-HAND GUIDANCE OF ELECTROMAGNETIC WAVES

(75) Inventors: Heinz Schweizer, Stuttgart (DE); Hedwig Graebeldinger, Erdmannhausen (DE); Manfred Berroth, Sindelfingen (DE); Harald Giessen, Bonn (DE); Axel Rumberg, Karlsruhe (DE); Liwei Fu, Stuttgart, CA (US)

(73) Assignee: Universitat Stuttgart (DE)

( * ) Notice: Subject to any disclaimer, the term of this patent is extended or adjusted under 35 U.S.C. 154(b) by 229 days.

(21) Appl. No.: 12/091,622

(22) PCT Filed: Sep. 15, 2006

(86) PCT No.: PCT/EP2006/009010

§ 371 (c)(1),
(2), (4) Date: Apr. 25, 2008

(87) PCT Pub. No.: WO2007/048468

PCT Pub. Date: May 3, 2007

(65) Prior Publication Data

US 2008/0291117 A1 Nov. 27, 2008

(30) Foreign Application Priority Data

Oct. 26, 2005 (DE) .................. 10 2005 052 208

(51) Int. Cl.
*H01Q 19/06* (2006.01)
(52) U.S. Cl. .................. 343/754; 343/753; 343/909; 359/569
(58) Field of Classification Search .......... 343/700 MS, 343/753, 754, 756, 909, 911 R; 359/569, 359/642; 250/504 R, 493.1
See application file for complete search history.

(56) References Cited

U.S. PATENT DOCUMENTS 6,958,729 B1 * 10/2005 Metz .................. 343/700 MS (Continued)

FOREIGN PATENT DOCUMENTS

WO 2006023195 A 3/2006

OTHER PUBLICATIONS

Urata J et al., "Superradiant Smith-Purcell emission", Physical Review Letters, New York, NY. US vol. 80, No. 3, Jan. 19, 1998, pp. 516-519, XP002277686, ISSN: 0031-9007, whole document.

(Continued)

*Primary Examiner*—Tho G Phan
(74) *Attorney, Agent, or Firm*—Donald R. Boys; Central Coast Patent Agency, Inc (57) ABSTRACT

A metamaterial having a negative refractive index is presented, which has a dielectric carrier material (12; 48), first electrically conductive sections (14.1, 14.2, 14.3, 14.4) and second electrically conductive sections (16.1, 16.2). The metamaterial is distinguished by the fact that the dielectric carrier material (12; 48) is realized as a volume which consists of one piece and which has at least one inner area which is prestructured by positive or negative rib or mesa structures (52.1, 52.2) in the dielectric carrier material (48) and is covered with first sections (14.1, 14.2, 14.3, 14.4) and second sections (16.1, 16.2) in such a way that the first sections form capacitive series impedances upon illumination with an electromagnetic wave having a specific propagation direction and polarization, while the second sections are arranged in such a way that they form inductive shunt impedances upon the illumination. An optical element, a preferred use of a metamaterial and also a method for producing a metamaterial are furthermore presented. The structuring of partial regions of the metamaterial can be effected with the aid of negative/positive mesa structures.

23 Claims, 6 Drawing Sheets

U.S. PATENT DOCUMENTS

| | | | |
|---|---|---|---|
| 7,218,285 B2 * | 5/2007 | Davis et al. | 343/754 |
| 7,538,946 B2 * | 5/2009 | Smith et al. | 359/569 |
| 2005/0200540 A1 * | 9/2005 | Isaacs et al. | 343/754 |
| 2006/0024395 A1 | 2/2006 | Haskell | |
| 2009/0135087 A1 * | 5/2009 | Gummalla et al. | 343/909 |
| 2009/0201221 A1 * | 8/2009 | Werner et al. | 343/909 |

OTHER PUBLICATIONS

Caloz C et al., "Transmission Line Approach of Left-Handed (LH) Materials and Microstrip Implementation of an Artificial LH Transmission Line", IEEE Transactions on Antennas and Propagation, vol. 52, No. 5, May 2004, pp. 1159-1165.

Linden S et al., "Magnetic Response of Metamaterials at 100 Terahertz", Science Magazine, vol. 306, No. 5700, Nov. 19, 2004, pp. 1351-1353.

Chen H et al., "Metamaterial Exhibiting Left-handed Properties over Multiple Frequency Bands", Journal of Physics, vol. 96, No. 9, Nov. 1, 2004, pp. 5338-5340.

Pendry J.B. et al., "Magnetism from Conductors and Enhanced Nonlinear Phenomena", IEEE Transactions on Microwave Theroy and Techniques, vol. 47, No. 11, Nov. 11, 1999, pp. 2075-2084.

* cited by examiner

METAMATERIAL HAVING THE CAPABILITY OF BROADBAND LEFT-HAND GUIDANCE OF ELECTROMAGNETIC WAVES

CROSS-REFERENCE TO RELATED DOCUMENTS

The present application claims priority to a German patent application serial number DE 10 2005 052 208.4-34 entitled "Metamaterial having the capability of broadband left-handed guidance of electromagnetic waves", which was filed on Oct. 26, 2005, which is incorporated herein in its entirety, at least by reference.

The invention relates to a metamaterial according to the main subject of patent claim 1, that is, a metamaterial having a negative refractive index, a dielectric carrier material, first electrically conductive sections and second electrically conductive sections.

Furthermore, the invention relates to an optical element according to the main subject of patent claim 12, a use of a metamaterial according to the main subject of patent claim 14 as well as a method for producing a metamaterial, in other words, a method according to the main subject of patent claim 15.

This type of a metamaterial is known from the publication "Metamaterial exhibiting left-handed properties over multiple frequency bands" by Chen et al, Journal of Applied Physics, Volume 96.

In the field of electrodynamics, a metamaterial is understood as being a composite material with electromagnetic properties that are not determined solely by the materials that make up the composite but in particular also by the structure of the composite. The term is used in particular when the composite material exhibits properties that are not known in naturally formed materials. An example for such properties is the so-called left-handedness when guiding electromagnetic waves.

When such waves propagate in naturally formed materials such as in air or in vacuum, the vectors of the electrical field strength, the magnetic field strength and the direction of propagation form a right-handed system. In other words: If the electrical field strength is located in the x-direction and the magnetic field strength in the y-direction of a Cartesian coordinate system, then the wave will propagate in the direction of the positive z-axis. The direction of the wave number vector corresponds to the direction of the energy movement through the wave, i.e., to the direction of its pointing vector.

However, if the three vectors form a left-handed system, the waves with the same orientation of electrical and magnetic field strength will propagate in the direction of the negative z-axis, while the energy movement continues in the positive z-direction. Wave number vector and pointing vector have an antiparallel orientation to each other. As is known from publications by Veselago in the Sixties of the last century, this left-handedness occurs when both the permeability $\mu$ and the permittivity $\in$ of a material are negative.

A unit cell of the metamaterial known from the referenced publication by Chen et al consists in principle of a planar dielectric carrier that is imprinted with a planar meander-shaped metal structure (cf. Chen et al, FIG. 1). According to Chen et al, this corresponds to an extended S-geometry of otherwise known split ring resonators. Each of the two metal structures exhibits four U-shaped parts. Relative to each other, the two metal structures are arranged mirror-inverted such that a base line of one U-shaped part on one side of the dielectric is located above an opening of a U-shaped part on the other side of the dielectric. Thus, the U-shaped parts form parts of a ring that is capacitively closed through the dielectric. As a result, dielectric currents in the capacities between the horizontal metal meanders permit the induction of ring currents in the rings when a magnetic field is applied, with the inductivity being proportional to the respective ring area (cf. Chen et al, FIG. 4).

Thus, this unit cell exhibits four ring areas located in series that are located above each other in a randomly specified order in the z-direction. If, for example, ten such metal structures are arranged in series in the x-direction on a dielectric plate and if, for example, sixty such plates are pressed together that are arranged adjacent to each other in the y-direction and pairs of them are each separated by an additional non-printed dielectric plate, then a three-dimensional metamaterial is formed that shall exhibit left-handed passband properties for more than two frequencies (more than two left-handed passbands). The starting point is an illumination with an electromagnetic wave that propagates in the x-direction and exhibits an electrical field strength that is polarized in the z-direction.

The structural widths of the unit cells introduced by Chen et al are of an order of magnitude of a few millimeters, which lets one expect an interaction with electromagnetic waves of wave lengths in the millimeter and centimeter ranges. According to these expectations, the band pass frequencies disclosed in the publications are in an order of magnitude of 10 GHz.

In summary, Chen et al introduce a metamaterial for the gigahertz range that exhibits a planar dielectric carrier material, first electrically conductive sections in the shape of the U-legs and second electrically conductive sections in the shape of the U-baseline.

Chen et al operate the meanders as oscillators, which implies a small bandwidth for a left-handed wave propagation.

In addition, a planar implementation of an artificial transmission line using microstrip lines is known from the publication "Transmission Line Approach of Left-Handed (LH) Materials and Microstrip Implementation of an Artificial LH Transmission Line" by Caloz et al, IEEE Transactions on Antennas and Propagation, Vol. 52, No. 5 that exhibits left-handed properties for microwaves, i.e., for the gigahertz range. According to the authors, this approach is based on non-resonating components and has, therefore, broadband properties.

Three-dimensional microstructures are known from the publication "Magnetism from Conductors and Enhanced Nonlinear Phenomena", by Pendry et al, IEEE Transactions on Microwave Theory and Techniques, Vol. 47, No. 11, November 1999 with said-microstructures being constructed of non-magnetic, conductive layers and with which negative values of a magnetic permeability can be achieved in the vicinity of resonances (compare FIG. 5). A negative electrical permittivity is mentioned by Pendry et al via a reference to a different document, however, no correlation is provided to the three-dimensional microstructure with the negative permeability.

In addition to the two aforementioned publications, which both introduce planar structures of electro-dynamic left-handed metamaterials for the gigahertz range, planar, periodic arrangements of individual, non-magnetic, metallic split ring resonators are known from the publication "Magnetic Response of Metamaterials at 100 Terahertz" by Linden et al, Science, Vol. 306, pages 1351-1353. Each resonator consists of a square with a side length of 320 nm made of 90 nm wide and 20 nm thick gold that frame a square area with side lengths of 140 nm at three sides. The boundary on the fourth side exhibits a slot with a slot width of 70 nm. The authors assign to this structure an LC resonant circuit as an equivalent circuit diagram, where the edges of the slot form a condenser and the remaining ring a coil (with one winding).

Incident light interacts with this structure if its electrical field strength exhibits a component that is perpendicular to the areas of the condenser and/or if its magnetic field strength has a component that is perpendicular to the coil area. According to Lenz's Law, the ring current induced in the ring closed via the dielectric current of the condenser generates a magnetic field with a field strength that is oriented in the opposite direction of the magnetic field strength of the incident light, which can lead to a negative permeability µ.

According to this publication, there is a need for metamaterials that are effective in the optical range. With their LC resonant circuits, Linden et al refer to resonant structures that exhibit either a negative permittivity or a negative permeability µ at wavelengths of 3 µm, i.e., at frequencies of 100 terahertz. Which one of these two parameters becomes negative depends on the orientation of the resonators in regard to the incident wave.

The state-of-the-art described indicates that there is a need for metamaterials that are effective in the range of optical frequencies. If the desired properties of the known metamaterials occur as a result of resonances, they will not occur outside a certain bandwidth of the resonances. Thus, the occurrence of the desired properties is limited to an, as a rule, comparatively narrow bandwidth. It is also troublesome that the range for the angle of incidence is relatively small for electromagnetic waves that exhibit these new properties.

Based on the state-of-the-art mentioned above, it is the objective of the invention to introduce a metamaterial having a negative refractive index in a broad optical spectral range (e.g., around a 100 THz range) even at a great angle of incidence of the optical radiation and in a material structure that allows for an easy implementation of optical elements such as mirrors, lenses, wave guides, couplers resonators and modulators. In addition, it shall be possible to manufacture the material easily and reliably and its structure shall be usable with other structure parameters, also for other frequency ranges, for example the gigahertz range. An additional objective is to introduce an optical element as well as a method for producing a metamaterial and a particularly advantageous evolving use of the metamaterial.

This objective is accomplished with the metamaterial of the aforementioned type through the characteristic features of claim 1. Concerning the optical element, the objective is achieved through the features of claim 12. With regard to use, the objective is achieved through the features of claim 14. Concerning the production method, the objective is achieved through the features of claim 15.

ADVANTAGES

With the known stacks of planar arrangements known from the state-of-the-art according to Chen, the thickness of the conductive first and second sections is limited for technological reasons. Thus, degrees of freedom for the dimensions of electrically connected sections exist only in the two dimensions of the area. In the area, the first and the second sections must be arranged such that they form an angle. Because the angles are located in planar dielectrics, the area between the legs of the angles in the third dimensions, i.e., in the direction of a normal to the surface, is not supported by dielectric material. When pressing together several dielectric plates provided with the first and second sections, mechanical stress and structural problems may occur, which interfere with the function as a metamaterial. This applies all the more, the smaller the structural widths of the arrangements of first and second sections are.

These disadvantages do not occur due to the fact that the dielectric carrier material of the metamaterial subject to the invention is realized of a volume consisting of one piece and exhibiting at least one inner area that is prestructured through positive or negative fin or mesa structures in the dielectric carrier material. Prestructuring allows for embedding of the first and the second sections in all three dimensions such that an optimum support of the first sections and the second sections by the dielectric material is achieved. This allows for a reduction of the structural widths down to the optically effective dimensions.

Non-planar prestructuring can be carried out through lithography and etching steps with the required accuracy. Dimensions that are realized on a planar surface with the known structures can be realized through non-planar prestructuring in the depth of the dielectric and thus perpendicular to the surface with the structure introduced here. Additional expansion of the conductive sections in the direction of the normal to the surface opens an additional degree of freedom for tailoring the inductive and capacitive properties through respective designs of the conductive sections. This provides, for example, the option of setting an application-oriented refractive index of the metamaterial. Such a metamaterial can be used, for example, to produce optical elements such as lenses or wave guides with negative refractive indexes. The material structure is designed such that additionally longer wavelengths outside of the spectral range of visible light all the way to mm- and cm-waves can be covered when the length parameters are adjusted accordingly.

An additional feature of the metamaterial subject to the invention is that the first sections and the second sections are arranged such that the first sections form capacitive serial impedances upon illumination with an electromagnetic wave of a specific direction of propagation and polarization, while the second sections are arranged such that they form inductive shunt impedances when illuminated. This arrangement transfers the principle of the equivalent circuit to optical structures. Thus, a simultaneous occurrence of negative values for the permittivity $\in$ and the permeability µ, as required for a left-handedness, is no longer limited to a narrow resonance frequency bandwidth. An advantageous result is, therefore, a left-handedness across a broad frequency range, for example.

Additional advantages become apparent from the description and the attached figures.

It is understood that the features mentioned above and still to be explained below can not only be used in the respective stated combinations but also in other combinations or by themselves without leaving the context of the present invention.

DRAWINGS

Exemplary embodiments of the inventions are presented in drawings and are explained in greater detail in the following description. Shown in schematic form are in.

Figure 1:
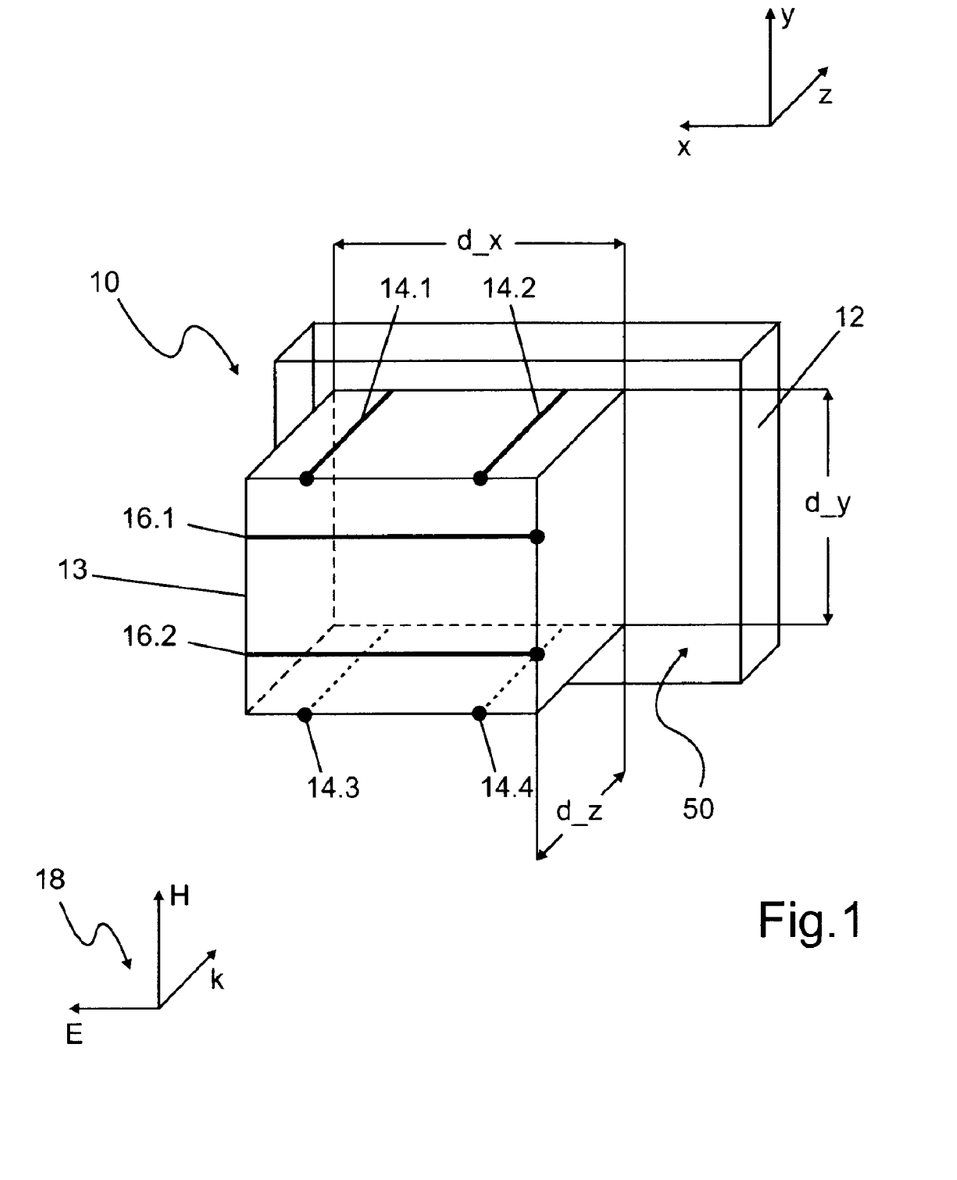
FIG. 1 a microcell of an exemplary embodiment of the metamaterial subject to the invention exhibiting a dielectric carrier material as well as first and second electrically conductive sections.

In detail, FIG. 1 shows a perspective view of a unit cell or micro cell 10 of a metamaterial subject to the invention in an interim stage of its production, exhibiting a dielectric carrier material 12 as well as first electrically conductive sections 14.1, 14.2, 14.3, 14.4 and second electrically conductive sections 16.1, 16.2. The first sections and the second sections can be arranged galvanically separated from each other as shown, or can be connected to each other. Furthermore, they may have a linear or planar design.

The dielectric carrier material 12 exhibits an inner area 50 that is prestructured through positive or negative fin or mesa structures 13 in the dielectric carrier material 12 and that has first sections 14.1, 14.2, 14.3, 14.4 and second sections 16.1, 16.2 placed on it such that the first sections 14.1, 14.2, 14.3, 14.4 form capacitive serial impedances when illuminated with an electromagnetic wave 18 with a specific direction of propagation k and polarization E, while the second sections 16.1, 16.2 are arranged such that they form shunt impedances when illuminated. As will be explained in greater detail below, the formation of the named impedances occurs according to the principle of the equivalent circuit of optical structures, whereby equivalent electrical circuit diagrams are assigned to the optical structures.

The shape of the mesa structures 13 is not limited to the presented cubic shape but can be realized in any shape that results in the desired impedances when the first and second sections are placed on them. It is important that the formation of capacitive serial impedances and inductive shunt impedances are favored because these support the left-handed wave propagation. Capacitive shunt impedances and inductive serial impedances, on the other hand, support a right-handed wave propagation and should not be formed if possible, or formed only to a relatively small extent.

The dimensions of the mesa structures 13 of FIG. 1 made of dielectric material exhibit characteristic lengths of d_x, d_y, d_z that may be equal but also different. However, to achieve an optically smooth metamaterial, these lengths should each be less than ¼ of the (effective) wave length that is to propagate left-handedly through the metamaterial. Values between ⅕ and 1/100 of the effective wave length are preferred for optical applications. A picture of larger metamaterial volumes is created from the microcell 10 through periodic continuation along the specified spatial directions x, y and z, whereby interim spaces are each to be filled with a dielectric material. After filling, the dielectric carrier material 12 is realized corresponding to a volume consisting of one piece in which the first sections 14.1, 14.2, 14.3, 14.4 and the second sections 16.1, 16.2 are embedded.

The first sections 14.1, 14.2 and 14.3, 14.4 are positioned in respective pairs in plane parallel to the x, z plane. The respective first sections located in such a plane form first grids. Correspondingly, the second sections 16.1, 16.2 are positioned in respective pairs in plane parallel to the x, y plane. The respective second sections located in such a plane form second grids.

When illuminating metamaterials exhibiting such grids with an electromagnetic wave 18 that propagates in the direction of the shown propagation vector k, and when its electrical field strength E together with its magnetic field strength H and the propagation vector k displays a right-handed system with the shown polarization of E, equivalent electrical circuit diagrams can be assigned to the grids according to the principle of equivalent circuits of optical structures. The aforementioned principle is described in general form in the Waveguide Handbook by N. Marcuvitz, M.I.T. Rad. Lab. Ser., Mc Graw-Hill, or also by R. Ulrich, Infrared Physics 7, 37, (1967).

Figure 2:
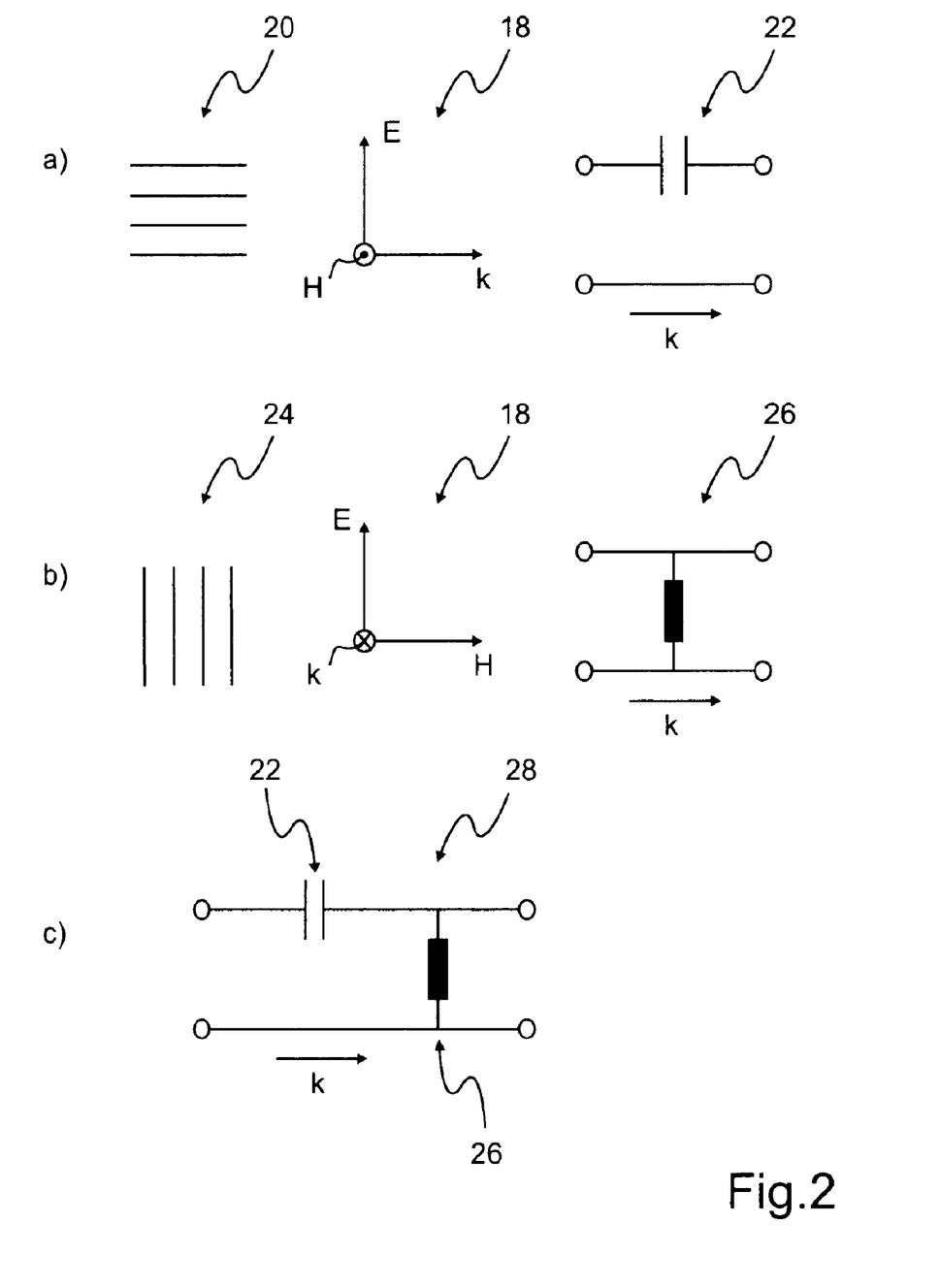
FIG. 2 Assignments of optical grids and their equivalent electrical circuits.

FIG. 2 summarizes the assignments relevant to the object of FIG. 1 of grids interacting with plane electromagnetic waves (E, H, k) 18 and their equivalent electrical circuits.

In this context, FIG. 2a shows a grid 20 reacting to the electromagnetic wave 18 in an electrical consideration like a capacity 22 that is located in the direction of propagation k of the wave 18 and thus like a longitudinally acting capacity 22. The relative orientation of the grid 20 and the wave 18 in FIG. 2a each correspond to the orientation of the first grid 14.1, 14.2 and the wave 18 in FIG. 1. Correspondingly, the first grid 14.1, 14.2 in FIG. 1 acts like a capacitive serial impedance 22.

Analogous, FIG. 2b shows a grid 24 reacting to the shown electromagnetic wave 18 in an electrical consideration like an inductivity acting perpendicular to the direction of propagation k, i.e., to a laterally acting inductivity 26. The relative orientation of the grid 24 and the wave 18 in FIG. 2b each correspond to the orientation of the second grid 16.1, 16.2 and the wave 18 in FIG. 1. Correspondingly, the second grid 16.1, 16.2 in FIG. 1 acts like an inductive shunt impedance 26.

As an outcome, the metamaterial formed of the microcells 10 result in an equivalent electrical circuit 28 as a serial connection of a serial capacity 22 and a shunt inductivity 26, as shown in FIG. 2c. Such an electrical circuit can be used also to describe the electrical behavior of transmission lines such that the behavior of metamaterial can be described in this respect using the same model.

A preferred embodiment of a metamaterial is, therefore, characterized in that the first sections and the second sections are arranged such that the first sections form capacitive serial impedances upon illumination with an electromagnetic wave of a certain direction of propagation and polarization, while the second sections are arranged such that they form inductive shunt impedances when illuminated.

This embodiment is based on transferring the principle of the equivalent circuit to optical structures. A simultaneous occurrence of negative values for the permittivity $\in$ and the permeability $\mu$, as required for a left-handedness, is then no longer limited to a narrow resonance frequency bandwidth. An advantageous result is, therefore, a left-handedness across a broad frequency range, for example.

When analyzing such a metamaterial that is made up of microcells with a characteristic length of $d_{cell}$, an impedance $Z'=Z/d_{cell}$ can be defined as a serial impedance per unit of length of the line. The unit of length $d_{cell}$ corresponds in this case to the characteristic length of the line, i.e., the microcell, in the direction of propagation. Furthermore, an additional impedance $Y'=Y/d_{cell}$ can be defined as shunt impedance per length of the line.

These impedances Z' and Y' are dependent on the permittivity $\in$ or the permeability $\mu$ according to the following correlations 1a, 1b, where $\omega$ stands for the angular frequency of the wave 18 and j stands for $$\frac{Z}{d_{Zelle}} = j \cdot \omega \cdot \mu \tag{1a}$$

$$\frac{Y}{d_{Zelle}} = j \cdot \omega \cdot \varepsilon \tag{1b}$$

the imaginary unit:

Equations 1a and 1b show that negative values for the permittivity $\in$ and the permeability $\mu$ for realizing a material with a negative refractive index can be achieved via a serial capacitance C and an inductive shunt L, because the following equations 2a, 2b apply to such parameters C and L:

$$\frac{Z}{d\_{Zelle}} = \frac{1}{j \cdot \omega \cdot C} \tag{2a}$$

$$\frac{Y}{d\_{Zelle}} = \frac{1}{j \cdot \omega \cdot L} \tag{2b}$$

1a and 2a show in particular that the permeability $\mu$ is negative and that its magnitude is dependent on the reciprocal value of the capacitance C. Correspondingly, 1b and 2b show in particular that the permittivity $\in$ is negative as well and that its magnitude is dependent on the reciprocal value of the inductivity L.

Looking at FIG. 1, it is apparent that in particular the first sections 14.1, 14.2, 14.3, 14.4 provide the metamaterial with capacitive properties and the second sections 16.1, 16.2 provide the metamaterial with inductive properties if they are arranged in the presented configuration in relation to the propagation vector k. In other words: By arranging the first sections parallel to the propagation vector of the light and the second sections parallel to each other in the plane perpendicular to the propagation vector (E, H or x, y-plane), serial capacitances, i.e., capacitive serial impedances, and corresponding inductive shunt impedances can be formed.

By applying the principle of the equivalent circuit to optical structures and using metallic or at least conductive U-loops, a particularly simple and cost-effective realization of capacitive serial impedances and inductive shunt impedances can be achieved.

Figure 3:
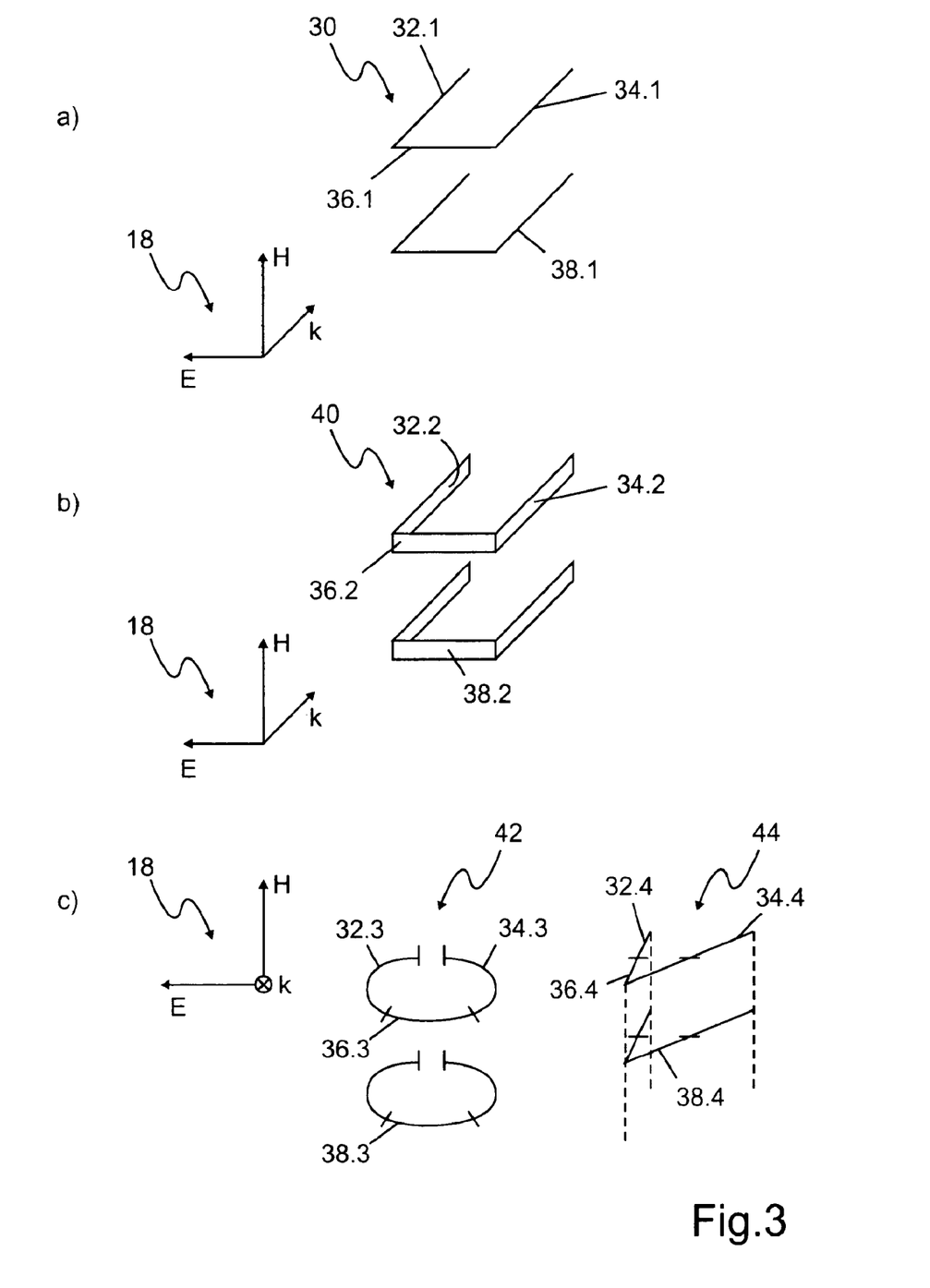
FIG. 3 Embodiments of variations of the metamaterial.

Other variations of the grid are possible as well. FIG. 3 shows some embodiments of such variations making no claim to be complete. FIG. 3a shows line-like U-structures 30, where the legs 32.1, 34.1 form a first, capacitive grid for the wave 18 and the baselines 36.1, 38.1 form a second, inductive grid. In this respect, the legs 32.1 and 34.1 correspond to the first sections 14.1 and 14.2 of FIG. 1, while the baselines 36.1 and 38.1 correspond to the second sections 16.1 and 16.2 of FIG. 1. FIG. 3b shows an embodiment 40 with planar U-structures, where the areas or plates 32.2, 34.2 are positioned parallel to the propagation vector k and the base areas or plates 36.2, 38.2 perpendicular to k.

Both modified structures 30 and 40 allow for the realization of a metamaterial, where the plates and wires 32.$i$, 34.$i$ with i=1 or 2 that are arranged parallel to the propagation vector k form the serial capacitance and the plates and wires 36.$i$, 38.$i$ that are arranged perpendicular to the propagation vector k form the shunt inductivity. The respective open structures form conducting loops with an opening that lies parallel to the electrical field strength and that can, therefore, be closed via capacitive dielectric currents. A conductor loop closed in this manner constitutes an inductivity that interacts with the magnetic field strength H.

One result of this is that the structures can be modified further. Examples of additional modifications are presented in FIG. 3c in the form of open circles 42 and open V-structures 44, which are, in a way, formed of the first sections 32.3, 34.3 and the second sections 36.3, 38.3 in the case of the circle 42 and of the first sections 32.4, 34.4 and the second sections 36.4, 38.4 in the case of the open V-structures 44. The area of the structures 42, 44 should again be penetrated by H and its opening should be bridged by E. All the embodiments introduced in this application have the advantage that the H-vector of the incident wave can be coupled into the metamaterial via the second sections, in an ideal case completely.

Figure 4:
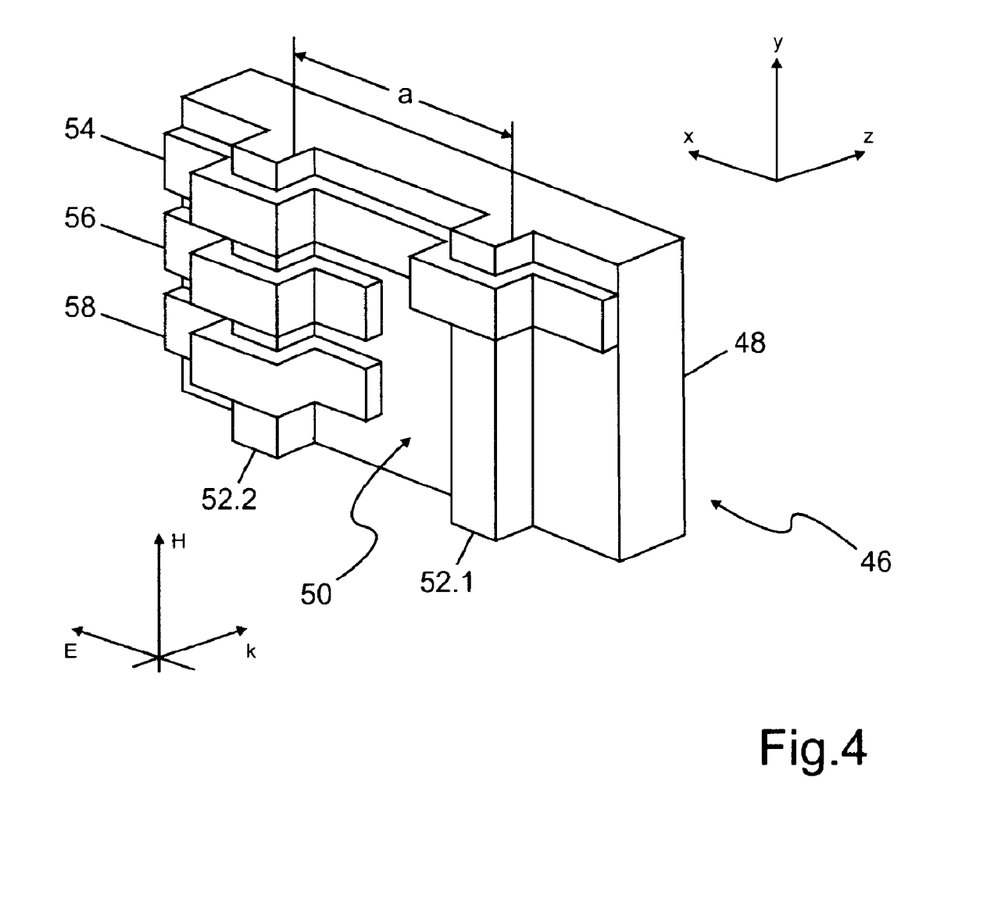
FIG. 4 a partial plane of a preferred embodiment of the metamaterial in an interim step of the production method.

FIG. 4 shows a perspective view of a partial plane 46 of a preferred embodiment of a metamaterial in an interim step of the production method.

The partial plane 46 exhibits a layer of a dielectric carrier material 48, which is transmissive for electromagnetic waves and which shall essentially have a low refractive index. Possible carrier materials 48 for the optical metamaterials are $SiO_2$ or $MgF_2$, for example. This also applies to the dielectric carrier material 12 mentioned above. However, within the scope of other embodiments, the dielectric $SiO_2$ material can also be replaced with the dielectric of an e-beam resist or of an optical resist material. An area 50 of the partial plane 46, for example, is prestructured by using lithographic- and etching steps known from semiconductor manufacturing, such that it exhibits positive or negative fin or mesa structures 52.1, 52.2. In this case, elevations across the surface area 50 are considered positive and depressions in the area 50 are considered negative. Various length to width ratios can be useful for both the positive and the negative structures.

Thereafter, a structure made of a conducting material is formed on the prestructured surface area 50. This can be done using metallization methods known from the semiconductor technology as well. Potential conducting materials are metals typical for the semiconductor technology such as Au, Ag or Al but also conductive semiconductor materials such as heavily doped polysilicon. Furthermore, the first electrically conductive sections 14.1, 14.2, 14.3, 14.4 and the second electrically conductive sections 16.1, 16.2 can also be manufactured using a galvanic method. By depositing conductive material in the form of meandering strips 54, 56, 58, several meandering strips 54, . . . made of a conductive material are arranged parallel to each other on the fin structure or the groove structure.

The meander strips 56, 58 are not shown fully in order to allow the fin structure of the surface area 50 of the carrier material 48 to appear more pronounced. However, as a rule they run consistently parallel to the meander strip 54. Subsequently, the arrangement of several meander strips 54, 56, 58, . . . will be designated as a multi-meander structure. Alternative to an arrangement in meander strips, the conductive materials can also be designed as an oscillator structure on a prestructured substrate 46. At any rate, the important thing is that the metamaterial receives structures that support a left-handed wave propagation stronger than a right-handed wave propagation.

Non-planar prestructuring can be carried out through lithography and etching steps with the required accuracy. Dimensions that are realized on a planar surface with the known structures can be realized through non-planar prestructuring in the depth of the dielectric and thus perpendicular to the surface with the structure introduced here. Additional expansion of the conductive sections in the direction of the normal to the surface opens an additional degree of freedom for tailoring the inductive and capacitive properties through respective designs of the conductive sections.

With the shown orientation of the partial plane 46 in relation to the electromagnetic wave (E, H, k) 18, each meander strip 54, 56, 58 forms a succession of U-loops with legs oriented parallel to the propagation vector k of the wave 18 and with baselines oriented parallel in the plane perpendicular to the plane of the propagation vector k, that is, in the E, H plane or the x, y plane. Thus, the respective legs form first sections and the baselines form respective second sections of a structure made of a conductive material and located on the fin structure or the groove structure.

As has been explained above, in interaction with the wave 18, this results in capacitive serial impedances and inductive shunt impedances.

The first sections acting in a capacitive manner and constituting the optical longitudinal capacitance of the structure are selected preferably such that they exhibit similar or equal impedance values in comparison to the second sections acting as inductive shunts.

In the orientation shown, the area of the U-loops that is effective in a longitudinal capacitive manner is positioned parallel to the propagation vector k while the area of the U-loop that is bordered by the U-legs and the U-baseline are penetrated by the magnetic field vector H, that is, in the y-direction. The electrical field vector is parallel to the meander strips 54, 56, 58 that extend in the E, H plane or in the x, y plane, respectively.

The side area of the U of the metal meander structure in the H, k plane or in the y, z plane, respectively, is a measure for the capacitive serial impedance of the meander structure, and the respective distance of the strips $\Lambda_Y$ in the y-direction in relation to its period $\Lambda_{xx}$ in the x-direction is a measure/parameter for the inductive shunt impedance.

The areas of the H-, k-plane (y-, z-plane) and the E-, H-plane (x-, y-plane) are positioned at a right angle to each other and can, therefore be varied when designing the structure of the metal material in the meander structure, such that the relationship of permittivity $\in$ and permeability $\mu$ can be adjusted through the design of the structure and in particular that it can be equal to One. With simultaneous negative values for the permeability $\mu$ and the permittivity $\in$, this leads to a value of −1 for the refractive index n. This then allows for the formation of structures that are free of reverse reflection because the vacuum value of the refractive index n=1.

The optimization of the serial capacitance can then be accomplished by simply increasing or decreasing the fin depth in the z-direction of the material and the optimization of the inductive shunt impedance through simply increasing/decreasing the widths h of the meander strips in the y-direction as well as through varying the distance $\Lambda y$-h in the meander strips to each other in the y-direction. In addition, there is the option of setting the permittivity $\in$ and the permeability $\mu$ in the optical spectral range either together negative or individually to negative values.

The expansion of the structures 54, 56, 58, . . . in y-direction provides an additional degree of freedom for tailoring the inductive and capacitive properties through respective designs of the conductive sections. The individual set options become clear already when looking at the following simple model for capacitive and inductive decoupling of an incident electromagnetic wave via capacitances and inductivities of the metamaterial. It is understood that in reality additional effects such as the excitation of plasmons occur frequency-dependent, which also allow a more complex coupling of incident electromagnetic waves into the metamaterial and which lead to deviations from the following purely classical effects.

The metallization in FIG. 4 exhibits U-structures with a base in the x-direction and legs in the z-direction. The structures have a strip height in the y-direction. E is located in the x-direction, H in the y-direction and k in the z-direction. The product of strip height and leg length determines the area of the serial capacitance C. This area is located in the y-z-plane. The product of leg length and base length determines the area that is perpendicular to H and, therefore, determines the shunt inductivity L. This area is located in the x-z-plane.

(1) If one changes the leg length (=fin depth, z-direction), the parameter of the z-direction that is common to both areas will change. An increase in the leg length increases both areas and, therefore, increases C and L independent of each other.

(2) If one changes the base length (=fin width, x-direction), only the L-area will change. Although the C-area does not change, the distance between the condenser plates will change. Thus, an increase of the base length increases L and decreases C, dependent of each other.

(3) If one changes the strip height (y-direction), only the C-area will change without changing the L-area. An increase in the strip height increases the C-area and thus the capacitance independent of the inductivity.

With options (1) and (2), the invention offers all possibilities for setting the desired capacitive and inductive properties, as is the case with the planar structures of Chen. However, option (3) is available only with the invention and not with the planar structures (in particular Chen) and constitutes a significant advantage of the invention. To change the C-area without changing the L-area with Chen, additional layers of the printed structures would have to be added. However, different from the object of the invention, in this case the L-area would not be a galvanically connected region. With Chen, any additional layer with a printed metal structure would effectively realize a new coil winding and thus cause changes in the inductivity.

Figure 5:
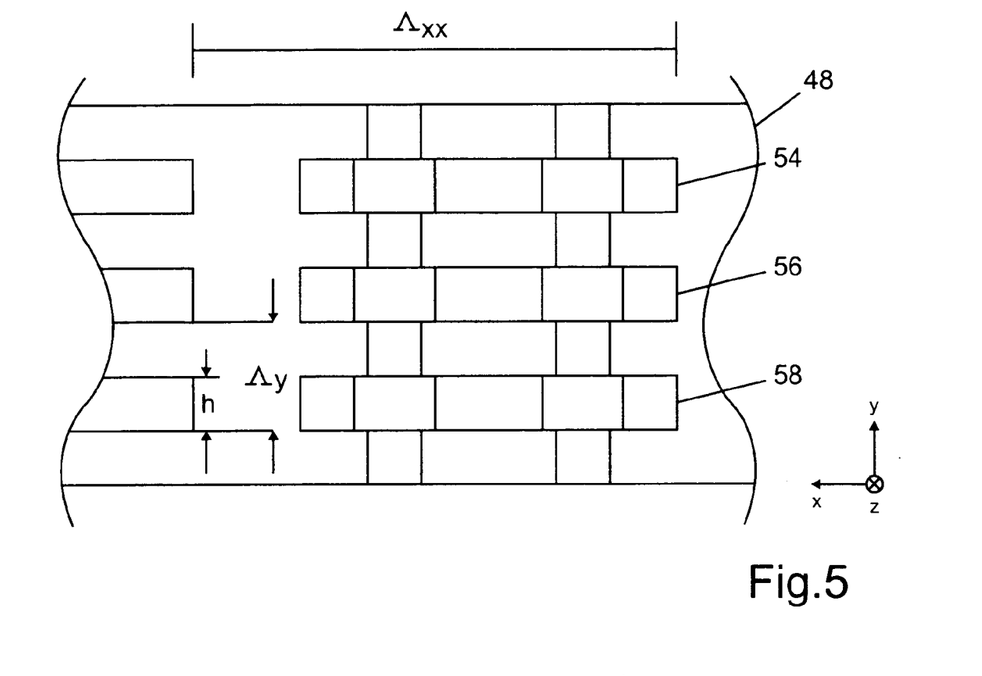
FIG. 5 a front view of the structure from FIG. 4.

FIG. 5 is a front view of a structure that comes into existence when continuing the partial plane 46 of FIG. 4 along the x-direction. For optical wavelengths, 30 nm-150 nm are advantageous values for the widths h of the meander strips in the y-direction. The width h, together with the distance $\Lambda Y$ of the meander strips in the y-direction and the period $\Lambda xx$ of the structure in the x-direction, influences the inductive shunt impedance and thus the value for the permittivity $\in$ of the metamaterial structure. $\Lambda xx$ can be significantly greater than the Bragg wavelength. $\Lambda Y$ should be smaller than the Bragg wavelength $\lambda_{Bragg}=2\, n_{eff}\Lambda$.

To produce a metamaterial, partial planes 46, or layers as shown in FIGS. 4 and 5, are stacked during the production process. For this purpose, the partial plane 46 with the metallization of the meander strips 54, 56, 58, . . . of a conductive material is covered with additional dielectric carrier material and then planished. For example, $SiO_2$ coatings can be deposited from the gas phase using chemical methods. By covering the metallization, it is entirely embedded in the dielectric carrier material.

The partial plane with the embedded metallization is then planished. Following, the planished carrier material is used as a layer that is to be prestructured for producing a second metallization layer. The metallization applied after prestructuring is again embedded in an additional dielectric carrier material. For the production of a metamaterial with a multitude of layers of conductive strips, these steps are repeated several times, whereby each time a planished metamaterial with a stack of n layers of conductive meander strips and thus n partial planes is used as a layer to be prestructured for producing a stack of layers with n+1 partial planes. In principle, the number of partial planes 46 can be as high as desired. Since the band width of the metamaterial increases with the number of partial planes, it can be set during the production by specifying this number.

Such a stacked metamaterial with partial planes that have been designed by applying the rules of the equivalent circuit to optical structures provides a virtually ideal capacitive serial impedance and a virtually ideal inductive shunt impedance.

Figure 6:
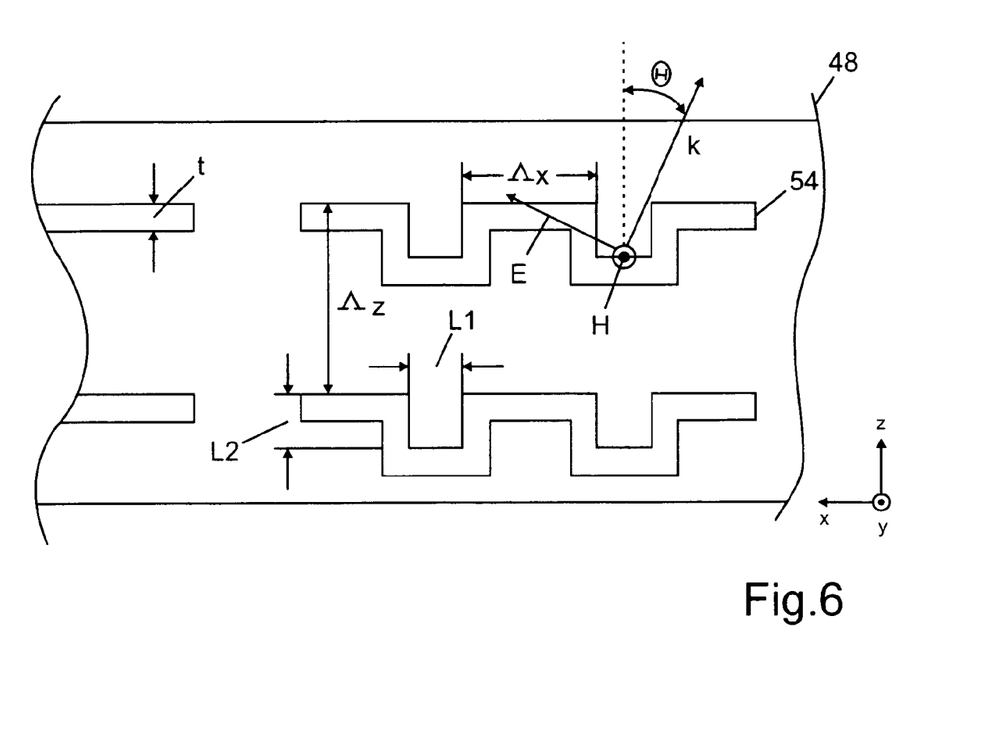
FIG. 6 a top view of the structure from FIG. 4 in connection with one potential orientation of an electromagnetic wave.

FIG. 6 shows a top view of the structure from FIG. 4 after producing and embedding a second metallization layer and subsequent planishing. Typical structure parameter values for optical wavelengths are:

t=10 nm-40 nm;

L1=50 nm-400 nm, this value is the result of the desired operating wavelength;

L2=30 nm-150 nm this value determines the serial impedance of the metamaterial and is also the result of the desired operating wavelength.

$\Lambda x$ and $\Lambda z$ shall be smaller than the Bragg wavelength $\lambda_{Bragg}=2\, n_{eff}\Lambda$, and at the same time constitute the size of the micro cells of the metamaterial in the x, z-plane. Analogous, $\Lambda x$ and $\Lambda Y$, i.e., the values for the size of the micro cells of the metamaterial in the x, y-plane shall be smaller than the Bragg wavelength=2 $\Lambda$.

To realize an essentially smooth metamaterial, where the interferences caused by the interaction of the first and second sections with the wave, are still negligible, the parameters $\Lambda x$ and $\Lambda z$ should be less than one fourth of the effective wavelength. Preferred values for optical applications are between $\frac{1}{100}$ and $\frac{1}{5}$ of the effective wavelength.

As a general rule for dimensioning, the distance between the fin or mesa structures of a layer should be between $\frac{1}{10}$ and $\frac{1}{5}$ of the effective wavelength, that is, the wavelength of the electromagnetic radiation for which the material is intended to be used. For the optical spectral range with wavelengths between about 600 nm and 2000 nm, typical distances of two layers are less than 200 nm to 400 nm. For frequencies in the gigahertz range on the other hand, distances at an order of magnitude of 50 µm to 100 µm are used.

Thus, by adjusting the structure parameters, the design principle of the metamaterial introduced here can be used for both the GHZ range with wavelengths around 3 mm and for the THz range with wavelengths between about 600 nm and about 2000 nm.

For the shown orientation of the metamaterial relative to the wave 18, the acceptance angle for the incident radiation is relatively great because for the polarization in the y-direction the H-field is effective with the full amplitude for any incident angle and the electrical field decreases only with the cosine of the incident angle $\Theta$. Thus, this orientation results in a wide acceptance angle that allows for the realization of optical elements with almost any desirable shape or geometry. In addition, no significant restriction of the material results through the critical angle of the total reflection of the dielectric carrier material.

Thus, the metamaterial or an optical element made with said metamaterial is preferably used with this orientation, where a magnetic field strength of an incident electromagnetic wave is located perpendicular to the second sections and an electrical field strength of the incident wave has a component that is located perpendicular to the first sections.

In this manner, a new broadband metamaterial is introduced that exhibits left-handed properties in the optical range of the electromagnetic spectrum and allows for a great angular range of the incident electromagnetic radiation. The broadband metamaterial exhibits integrated metallizations with structural magnitudes far below the wavelength of visible light. According to the principle of the equivalent circuit, the metallizations fulfill an electromagnetic function such that the metamaterial has simultaneously a negative permittivity $\in$ and a negative permeability $\mu$ beginning at the frequency 0 to a certain upper limit frequency. The upper limit frequencies $\omega_{se}$, $\omega_{sh}$ (se=serial; sh=shunt) result from a portion of a capacitive serial impedance in connection with a portion of an inductive serial impedance or a portion of the inductive shunt impedance in connection with a capacitive shunt impedance on the impedance of the overall structure with $\omega_{se}=1/(L_{se}\, C_{se})^{1/2}$ or $\omega_{sh}=1/(L_{sh}\, C_{sh})^{1/2}$, respectively, where $\omega_{se}<\omega_{sh}$. —Three areas come into existence if one plots the refractive index of the metamaterial that depends on $\omega_{se}$ and $\omega_{sh}$ against the frequency $\omega$. For low frequencies $\omega<\omega_{se}$, both $\in$ and $\mu$ are negative, resulting in the desired left-handed properties.

For medium frequencies $\omega_{se}<\omega<\omega_{sh}$, only $\in$ remains negative while $\mu$ is positive; the result is an area of damped wave propagation (slow photons).

For high frequencies $\omega>\omega_{sh}$, both $\in$ and $\mu$ are positive, resulting in right-handed properties. In an embodiment of a metamaterial subject to the invention, the resultant values were, for example, about 180 THz for $\omega_{se}$ and about 340 THz for $\omega_{sh}$. A particular advantage of the metamaterial subject to the invention is that the frequency range of a left-handed wave propagation can be set separately by changing the capacitive and inductive contributions of a microcell.

Because the serial capacity is accompanied by a parasitic serial inductivity positioned parallel to the serial capacity (serial=in k-direction), a right-handed behavior occurs at relatively low frequencies. Thus, the desired left-handed wave propagation appears in the result over a certain bandwidth. This bandwidth is greater than left-handed wave propagation of known resonant structures that are coupled to resonance bandwidths, such as the ones known from the publication of Chen et al mentioned at the beginning. The bandwidth of the metamaterial subject to the invention can be increased further by inserting an additional inductive grid as shown in FIG. 2b.

Figure 7:
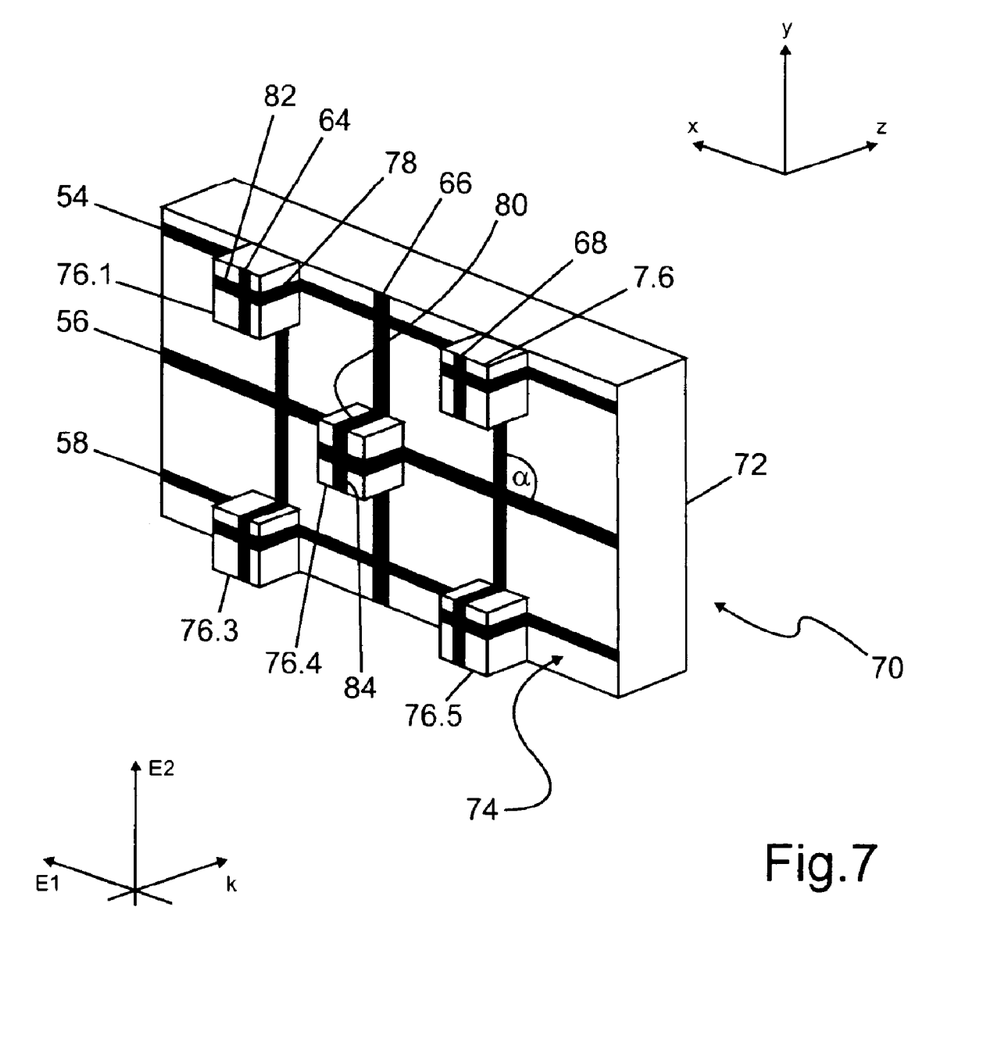
FIG. 7 an embodiment of a mesa meander structure.

FIG. 7 shows an embodiment of a mesa meander structure with first meander strips 54, 56, 58 extending horizontally and additional meander strips 64, 66, 68 arranged at an angle $\alpha$, preferably at a right angle, to the first meander strips 54, 56, 58 on a partial plane 70. Similar to the partial plane 46 of FIG. 4, the partial plane 70 exhibits a layer of a dielectric carrier material 72, which is transmissive for electromagnetic waves and which shall have an essentially low refractive index. An area 74 of the partial plane 70 is prestructured such that it exhibits positive or negative mesa structures 76.1, 76.2, . . . , 76.5. In this case, elevations across the surface area 74 are considered positive and depressions in the area 74 are considered negative. Various length to width ratios can be useful for both the positive and the negative structures. Regarding the distances, the explanations for FIGS. 4, 5 and 6 apply analogously. Regarding the dimensions of the mesa structures 76.1, 76.2, . . . , 76.5, the explanations for FIG. 1 apply analogously.

Thereafter, the conductive meander strips 54, 56, 58 and 64, 66, 68 are formed on the prestructured area 74 as described in connection with FIG. 4. The first meander strips 54, 56, 58 exhibit first sections 78 that are arranged in the z-direction. The first sections form a first part of the first sections. The second meander strips 64, 66, 68 also exhibit first sections 80 that are arranged in the z-direction. These first sections form a second part of the first sections.

In addition, the first meander strips 54, 56, 58 exhibit second sections 82 that are arranged in the x-direction and that form a first part of the second sections. The second meander strips 64, 66, 68 exhibit second sections 84 that are arranged in the y-direction. These second sections 84 form a second part of the second sections.

Thus, a metamaterial is provided, where the first part 78 of the first sections is arranged such that the first sections 78 of the first part form capacitive serial impedances when illuminated with an electromagnetic wave of a certain direction of propagation k and a first direction of polarization E1, while the first part of the second sections 82 are arranged such that the second sections 82 form inductive shunt impedances at this illumination with the polarization E1.

In addition, the first part 80 of the first sections and the second part 84 of the second sections is arranged such that the first sections of the second part 80 of the first sections form capacitive serial impedances when illuminated with an electromagnetic wave of a certain direction of propagation k and a second direction of polarization E2, while the second sections of the second part 84 of the second sections are arranged such that the they form inductive shunt impedances at this illumination.

The advantage of this embodiment in addition to all other advantages is that the embodiments presented in this application are largely independent of the polarization of the incident wave. The wave does not need to exhibit a parallel linear polarization in relation to the first meander strips or the second meander strips. The direction of polarization can generally be in the plane spanned by E1 and E2. As a result, the embodiment of FIG. 7 works also with circular polarized light, for example. As an additional advantage, an additional increase in the bandwidth has become apparent across which a left-handed wave propagation occurs.

The intersecting arrangement of the first meander strips 54, 56, 58 and the second meander strips 64, 66, 68 can also be formed by stacking layers of planished partial planes 46 of FIG. 4, with two adjacent partial planes 46 being arranged skewed toward each by the angle α. Furthermore, the intersecting arrangement can be formed with or without an interim dielectric layer between the first meander strips 54, 56, 58 and the second meander strips 64, 66, 68.

In addition, in each of the embodiments described above, the meander strips do not need to extend in a straight line but may also extend in a curved manner in order to improve the coupling in of the wave into the metamaterial. It is also understood that a negative of the presented structures, i.e., a structure with an interchanged arrangement of the conductive meander strips and the dielectric structures also constitutes a metamaterial with comparable properties according to Babinet's theorem.

The invention claimed is:

1. A metamaterial having a negative refractive index and exhibiting a dielectric carrier material (12; 48), first electrically conductive sections (14.1, 14.2, 14.3, 14.4) and second electrically conductive sections (16.1, 16.2), characterized in that the dielectric carrier material (12; 48) is realized as a volume consisting of one piece that exhibits at least one inner area (50), which is prestructured by positive or negative fin or mesa structures (52.1, 52.2) in the dielectric carrier material (48), and is covered with first sections (14.1, 14.2, 14.3, 14.4) and second sections (16.1, 16.2) such that the first sections form capacitive serial impedances when illuminated with an electromagnetic wave of a specific direction of propagation and polarization, while the second sections are arranged such that they form inductive shunt impedances upon illumination.

2. A metamaterial as set forth in claim 1, characterized by line-like structures (32.1, 34.1, 36.1, 38.1) as the first sections and second sections.

3. A metamaterial as set forth in claim 2, characterized in that first sections and second sections form partial sections of a structure (54, 56, 58) made of a conductive material and being located on the positive or negative fin or mesa structures (52.1, 52.2).

4. A metamaterial as set forth in claim 3, characterized in that several structures (54, 56, 58) made of a conductive material are arranged parallel to each other on positive or negative fin or mesa structures (52.1, 52.2).

5. A metamaterial as set forth in claim 4, characterized in that it exhibits several partial planes (46), with each partial plane (46) exhibiting a layer of the dielectric carrier material (48) with an inner area (50) and first sections and second sections.

6. A metamaterial as set forth in claim 5, characterized in that it exhibits three to ten partial planes.

7. A metamaterial as set forth in claim 5, characterized in that a distance between positive or negative fin or mesa structures (52.1, 52.2) in one partial plane as well as a distance between two partial planes is 200 nm to 400 nm.

8. A metamaterial as set forth in claim 5, characterized in that a distance between positive or negative fin or mesa structures (52.1, 52.2) in one partial plane as well as a distance between two partial planes is 50 µm to 100 µm.

9. A metamaterial as set forth in claim 5, characterized in that a distance between positive or negative fin or mesa structures (52.1, 52.2) in one partial plane as well as a distance between two partial planes is one tenth to one fifth of the wavelength of the incident wave.

10. A metamaterial as set forth in claim 1, characterized by planar structures (32.2, 34.2, 36.2, 38.2) as the first sections and as second sections.

11. A metamaterial as set forth in claim 1, characterized in that a depth (d_z) of the fin or mesa structures is less than of an effective wavelength of the metamaterial.

12. A metamaterial as set forth in claim 1, characterized in that a first part (78) of the first sections and a first part (82) of the second sections are arranged such that the first sections of the first part (78) form capacitive serial impedances when illuminated with an electromagnetic wave of a specific direction of propagation (k) and a first direction of polarization (E1), while the second sections of the first part (82) of the second sections are arranged such that they form inductive shunt impedances upon illumination, and that a second part (80) of the first sections and a second part (84) of the second sections are arranged such that the first sections of the second part (80) of the first sections form capacitive serial impedances when illuminated with an electromagnetic wave of a specific direction of propagation and a second direction of polarization (E2), while the second sections of the second part (84) of the second sections are arranged such that they form inductive shunt impedances upon illumination.

13. An optical element of any desired geometry, characterized in that it exhibits a metamaterial as set forth in the claim 1.

14. An optical element as set forth in claim 13, characterized in that it exhibits a metamaterial as set forth in claim 8 with its first sections and second sections dimensioned such that the ratio of a permeability µ and a permittivity ∈ of the metamaterial equals One.

15. Use of a metamaterial as set forth in claim 13, characterized in that it is carried out with an orientation of the metamaterial at which a magnetic field strength (H) of an incident electromagnetic wave (18) is positioned perpendicular to the second sections and an electrical field strength (F) of the incident wave (18) has a component that extends perpendicular to the first sections.

16. A use of a metamaterial as set forth in an optical element as set forth in claim 13 for guiding electromagnetic waves, characterized in that the metamaterial can be used with adjusted structure parameters in a broad frequency range, ranging from the GHz frequency range to the THz frequency range.

17. Use of a metamaterial as set forth in claim 1, characterized in that it is carried out with an orientation of the metamaterial at which a magnetic field strength (H) of an incident electromagnetic wave (18) is positioned perpendicular to the second sections and an electrical field strength (F) of the incident wave (18) has a component that extends perpendicular to the first sections.

18. A use of a metamaterial as set forth in claim 1 for guiding electromagnetic waves, characterized in that the metamaterial can be used with adjusted structure parameters in a broad frequency range, ranging from the GHz frequency range to the THz frequency range.

19. A method for producing a metamaterial exhibiting a dielectric carrier material (12; 48), first electrically conductive sections (14.1, 14.2, 14.3, 14.4) and second electrically conductive sections (16.1, 16.2), characterized in that the dielectric carrier material (12; 48) is realized as a volume consisting of one piece in which at least one inner area (50) is prestructured by positive or negative fin or mesa structures (52.1, 52.2) and is covered with first sections (14.1, 14.2, 14.3, 14.4) and second sections (16.1, 16.2) such that the first sections form capacitive serial impedances when illuminated with an electromagnetic wave of a specific direction of propagation and polarization, while the second sections are arranged such that they form inductive shunt impedances upon illumination.

20. A method as set forth in claim 19, characterized in that a layer is produced of a dielectric carrier material (48), in that the layer is prestructured such that a surface (50) of a layer does not exhibit planar positive or negative fin or mesa structures, the surface (50) is covered with meander strips (54, 56, 58) made of a conductive material and in that the formed structure is covered with additional dielectric carrier material and thereafter is planished.

21. A method as set forth in claim 20, characterized in that the planished carrier material is used as a prestructured layer.

22. A method as set forth in claim 21, characterized in that for a production of a metamaterial with a multitude of layers of conducting strips, these steps are repeated several times, whereby each time a planished metamaterial with a stack of layers exhibiting n layers of conductive strips is used as a layer to be prestructured for producing a stack of layers with n+1 layers of conductive coatings.

23. A method for producing a metamaterial as set forth in claim 19, characterized in that the first electrically conductive sections (14.1, 14.2, 14.3, 14.4) and second electrically conductive sections (16.1, 16.2) are produced using a galvanic method.

* * * * *